United States Patent [19]
Ohnishi et al.

[11] Patent Number: 5,691,220
[45] Date of Patent: Nov. 25, 1997

[54] PROCESS OF FABRICATING SEMICONDUCTOR DEVICE HAVING CAPACITOR ELECTRODE IMPLANTED WITH BORON DIFLUORIDE

[75] Inventors: Sadayuki Ohnishi; Koichi Ando, both of Tokyo, Japan

[73] Assignee: NEC Corporation, Tokyo, Japan

[21] Appl. No.: 611,901

[22] Filed: Mar. 6, 1996

[30] Foreign Application Priority Data

Mar. 6, 1995 [JP] Japan .................... 7-045604

[51] Int. Cl.⁶ .................... H01L 21/8242
[52] U.S. Cl. .................... 437/52; 437/60; 437/919; 437/47
[58] Field of Search .................... 437/47, 60, 52, 437/919; 148/DIG. 14

[56] References Cited

U.S. PATENT DOCUMENTS

| | | | |
|---|---|---|---|
| 5,286,668 | 2/1994 | Chou | 437/52 |
| 5,438,541 | 8/1995 | Ando | 365/182 |
| 5,447,878 | 9/1995 | Park et al. | 437/52 |
| 5,518,946 | 5/1996 | Kuroda | 437/52 |

FOREIGN PATENT DOCUMENTS 7-78886  3/1995  Japan .

*Primary Examiner*—Jey Tsai
*Attorney, Agent, or Firm*—Foley & Lardner

[57] ABSTRACT

A stacked storage capacitor of a dynamic random access memory cell has a p-type polysilicon layer forming an upper part of an accumulating electrode, a dielectric film structure and a p-type polysilicon counter electrode, and boron difluoride is ion implanted into a non-doped polysilicon layer for the counter electrode so as to decrease leakage current density rather than a boron-implanted polysilicon counter electrode.

12 Claims, 14 Drawing Sheets

PROCESS OF FABRICATING SEMICONDUCTOR DEVICE HAVING CAPACITOR ELECTRODE IMPLANTED WITH BORON DIFLUORIDE

FIELD OF THE INVENTION

This invention relates to a process of fabricating a semiconductor device and, more particularly, to a process of fabricating a semiconductor device having capacitor electrodes implanted with boron difluoride.

DESCRIPTION OF THE RELATED ART

Research and development efforts are been made for a storage capacitor with large capacitance for use in a dynamic random access memory cell. One of the approaches is to three-dimensionally fabricate the storage capacitor such as a stacked capacitor, and another approach is to make the dielectric film thin. Although various insulating materials are available for the dielectric film of the storage capacitor, the dielectric film presently requested is equivalent to a silicon oxide film of about 5 nanometers thick under the dielectric constant of 3.82. The dynamic random access memory cell stores a data bit in the form of electric charge, and needs at least 30 fF in view of influences of alpha-particles.

FIGS. 1A to 1D illustrates a typical example of the process of fabricating a dynamic random access memory cell. The prior art process starts with preparation of a p-type silicon substrate 1, and a field oxide layer 1a is selectively grown on the major surface of the p-type silicon substrate 1. The field oxide layer 1a defines active areas, and a dynamic random access memory cell is assigned to one of the active areas.

The active area is thermally oxidized, and the thermal oxidation grows a gate oxide layer 2a over the active area. Conductive substance is deposited over the entire surface of the structure, and is patterned into a gate electrode 2b. The gate electrode 2b forms a part of a word line.

Subsequently, n-type dopant impurity is ion implanted into the active area, and a source region 2c and a drain region 2d are formed in the active area in a self-aligned manner with the gate electrode 2b. The gate oxide layer 2a, the gate electrode 2b, the source region 2c and the drain region 2d as a whole constitute a switching transistor incorporated in the dynamic random access memory cell.

Insulating substance is deposited over the entire surface of the structure, and forms an first inter-level insulating layer 3. An appropriate photo-resist mask (not shown) is formed on the first inter-level insulating layer 3, and exposes a part of the first inter-level insulating layer 3 over the source region 2c. Using the photo-resist mask, the first inter-level insulating layer 3 and the gate oxide layer 2a are partially etched away, and a contact hole 3a is formed in the first inter-level insulating layer as shown in FIG. 1A.

Non-doped polysilicon is deposited to 150 nanometers thick over the first inter-level insulating layer 3 by using a low-pressure chemical vapor deposition, and forms a non-doped polysilicon layer. The non-doped polysilicon layer 4 penetrates through the contact hole 3a, and is held in contact with the n-type source region 2c. P-type dopant impurity undesirably forms a p-n junction with the n-type source region 2c, and, for this reason, phosphorous is introduced into the non-doped polysilicon layer. The phosphorous converts the non-doped polysilicon layer to an n-type doped polysilicon layer 4 as shown in FIG. 1B, and the dopant impurity of the n-type doped polysilicon layer 4 is of the order of $10^{20}$ cm$^{-3}$.

Subsequently, an appropriate photo-resist mask (not shown) is formed on the n-type doped polysilicon layer 4, and the n-type doped polysilicon layer 4 is patterned into an accumulating electrode 4a. Silicon nitride is deposited over the entire surface of the structure, and the accumulating electrode 4a is covered with a silicon nitride layer 4b. The surface of the silicon nitride layer 4b is oxidized in water-vapor containing oxygen gas, and a silicon oxide layer 4c is laminated on the silicon nitride layer 4b as shown in FIG. 1C. The silicon nitride layer 4b and the silicon oxide layer 4c form in combination a dielectric film structure 4d. The total thickness of the silicon nitride layer 4b and the silicon oxide layer 4c is equivalent to a silicon oxide layer of 5 nanometers thick.

Non-doped polysilicon is deposited to 150 nanometers thick by using the low-pressure chemical vapor deposition over the silicon oxide layer 4c, and phosphorous is introduced into the non-doped polysilicon layer. The phosphorous converts the non-doped polysilicon layer to an n-type doped polysilicon layer 4e as shown in FIG. 1D, and a counter electrode is formed from the n-type doped polysilicon layer 4e. The accumulating electrode 4a, the dielectric film structure 4d and the counter electrode 4e as a whole constitute a stacked storage capacitor of the dynamic random access memory cell.

Though not shown in the drawings, a second inter-level insulating layer is formed on the stacked storage capacitor and the first inter-level insulating layer 3, and a bit contact (not shown) is formed through the first and second inter-level insulating layers. The n-type drain region 2d is partially exposed to the bit contact. Conductive metal is deposited on the second inter-level insulating layer, and is patterned into a bit line (not shown) held in contact through the bit contact with the n-type drain region 2d.

The thinning limit of the dielectric film structure 4d is equivalent to 5 nanometers thick. The thinning thickness is not a theoretically calculated value, but is empirical value.

If the dielectric film structure is made thinner than the equivalent thickness of 5 nanometers, leakage current is increased due to a tunneling effect, and the stacked storage capacitor hardly holds a data bit under the standard refreshing cycle.

FIG. 2 illustrates an energy band diagram created in the stacked storage capacitor in thermal equilibrium, and the work function is taken into account. Ef and Ev are indicative of the Fermi level and the top edge of the valence band, respectively. The silicon nitride layer 4b and the silicon oxide layer 4c form in combination the dielectric film structure 4d, and, accordingly, the energy band diagram contains a narrow energy band gap Eg1 of about 5 eV and a wide energy band gap Eg2 of about 8 eV between the n-type doped polysilicon layers 4e and 4a. The bottom edge of the conduction band for the silicon oxide is higher in electron energy than the bottom edge of the conduction band for the silicon nitride, and a potential discontinuity dE1 of about 1 eV takes place between the bottom edge of the conduction band for the silicon oxide and the bottom edge of the conduction band for the silicon nitride. On the other hand, the Fermi level for the n-type doped polysilicon is lower in electron energy than the bottom edge of the conduction band for the silicon oxide, and a potential barrier dE2 of about 3 eV takes place between the n-type doped polysilicon counter electrode 4e and the silicon oxide layer 4c.

If the dielectric film structure 4d is replaced with a silicon oxide layer 4x equivalent thereto, the energy band in thermal equilibrium is illustrated in FIG. 3A.

The counter electrode 4e is applied with a half of the positive power voltage Vcc at all times, and the potential level at the accumulating electrode 4a varies between zero to the positive power voltage Vcc.

When the potential difference between the accumulating electrode 4a and the counter electrode 4e is zero, the potential barrier of 3 eV takes place for the n-type doped polysilicon counter electrode 4e as shown in FIG. 3A.

When the accumulating electrode 4a is biased to the counter electrode 4e by +1 volt, the energy band is changed from FIG. 3A to FIG. 3B, and the potential barrier of 3 eV takes place between the n-type doped polysilicon counter electrode 4e and the silicon oxide layer 4x. The potential barrier of 3 eV relates to the leakage current due to the tunneling.

When the accumulating electrode 4a is biased to the counter electrode 4e by −1 volt, the energy band is changed from FIG. 3A to FIG. 3C, and the potential barrier of 3 eV takes place between the n-type doped polysilicon accumulating electrode 4a and the silicon oxide layer 4x. The potential barrier of 3 eV also relates to the leakage current due to the tunneling.

Thus, the potential barrier of 3 eV relates to the leakage current due to the tunneling regardless of the positive/negative bias, and the reason whey the dielectric film structure 4d reaches the limit on the thickness at 5 nanometers is derived from the potential barrier of 3 eV.

The present inventor contemplated the limit on the thickness, and concluded that p-type silicon would provide a break-through. The conclusion resulted in Japanese Patent Application No. 5-221564, and the Japanese Patent Application was published as Japanese Patent Publication of Unexamined Application No. 7-78886. U.S. Ser. No. 8/301, 589 had been filed on the basis of the Japanese Patent Application, and resulted in U. S. Pat. No. 5,438,541. According to the previous invention, at least one of the surface portion of the counter electrode and the surface portion of the accumulating electrode is formed of p-type silicon, and the p-type silicon allows a manufacturer to decrease the thickness of the dielectric layer at 87 percent without increase of the leakage current. When both of the surface portion of the accumulating electrode and the surface portion of the counter electrode are formed of p-type silicon, the leakage current is drastically decreased.

However, the drastic effect is not obtained at all times, and a fabrication process has an influence on it.

SUMMARY OF THE INVENTION

It is therefore an important object of the present invention to provide a process of fabricating a semiconductor memory device which decreases leakage current between an accumulating electrode and a counter electrode.

The present inventor has been making research and development efforts for a fabrication process, and notices that boron difluoride ($BF_2$) is effective against the leakage current.

To accomplish the object, the present invention proposes to dope a polysilicon layer with boron difluoride.

In accordance with one aspect of the present invention, there is provided a process of fabricating a semiconductor device, comprising the steps of: a) forming a first electrode having a first semiconductor layer doped with a p-type impurity; b) covering a surface of the first semiconductor layer with a dielectric layer; c) covering the dielectric layer with a second semiconductor layer; and d) implanting boron difluoride into the second semiconductor layer for forming a second electrode held in contact with the dielectric layer, the first electrode, the dielectric layer and the second electrode form in combination a capacitor.

In accordance with another aspect of the present invention, there is provided a process of fabricating a semiconductor device including a dynamic random access memory cell having a capacitor, comprising the step of ion implanting boron difluoride into a polysilicon over a dielectric layer for forming a counter electrode.

BRIEF DESCRIPTION OF THE DRAWINGS

The features and advantages of the process of fabricating a semiconductor memory cell according to the present invention will be more clearly understood from the following description taken in conjunction with the accompanying drawings in which.

DESCRIPTION OF THE PREFERRED EMBODIMENT

Figure 1A:
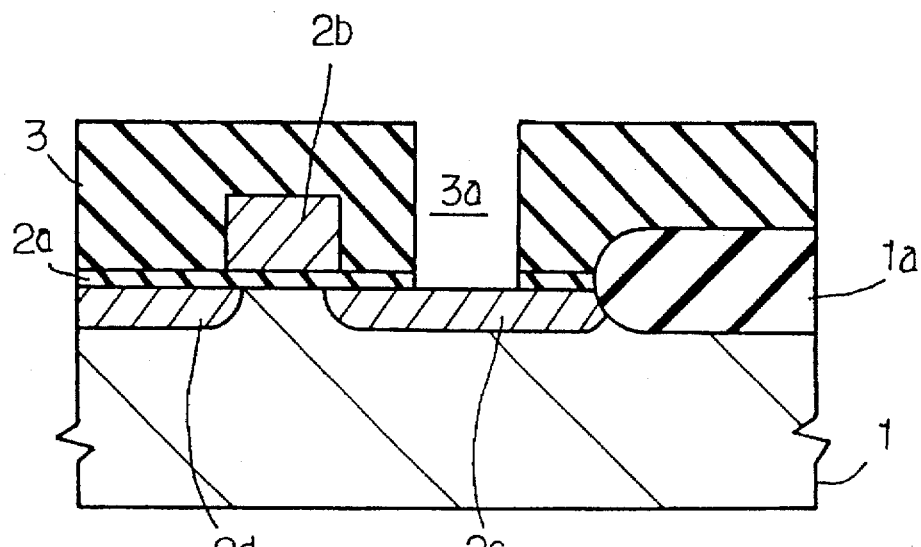
FIGS. 1A to 1D are cross sectional views showing the prior art process sequence for fabricating the dynamic random access memory cell.
Figure 1B:
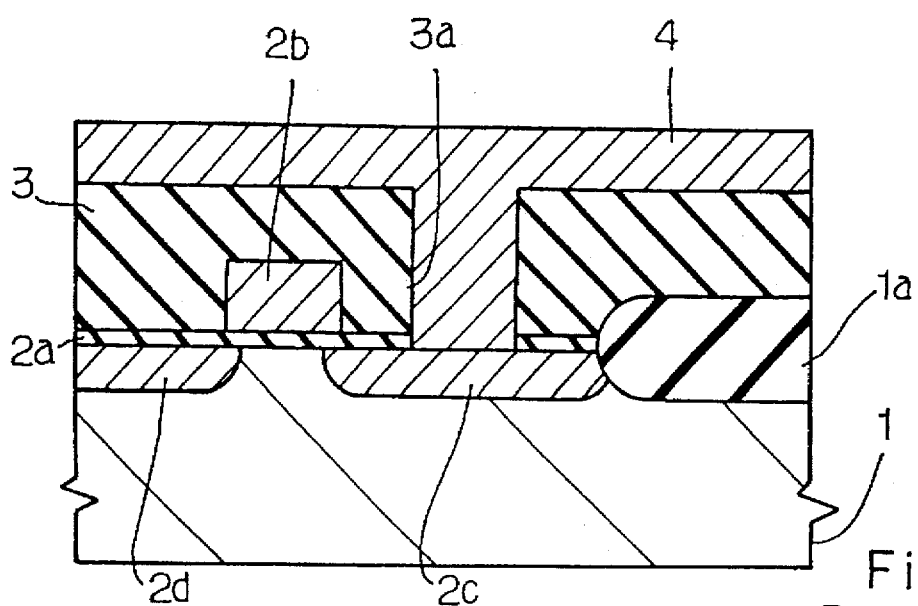
Figure 1C:
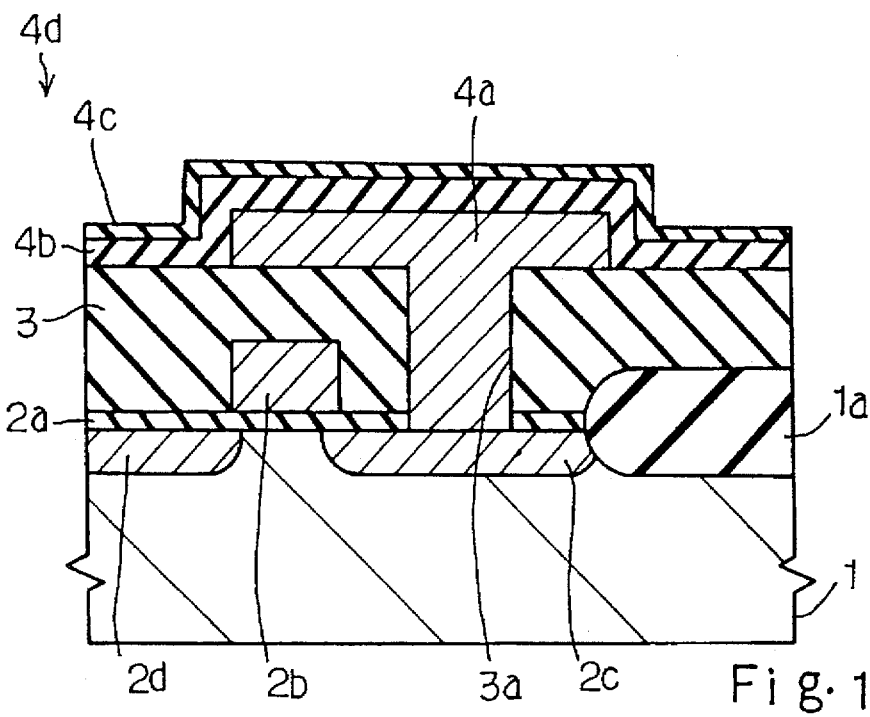
Figure 1D:
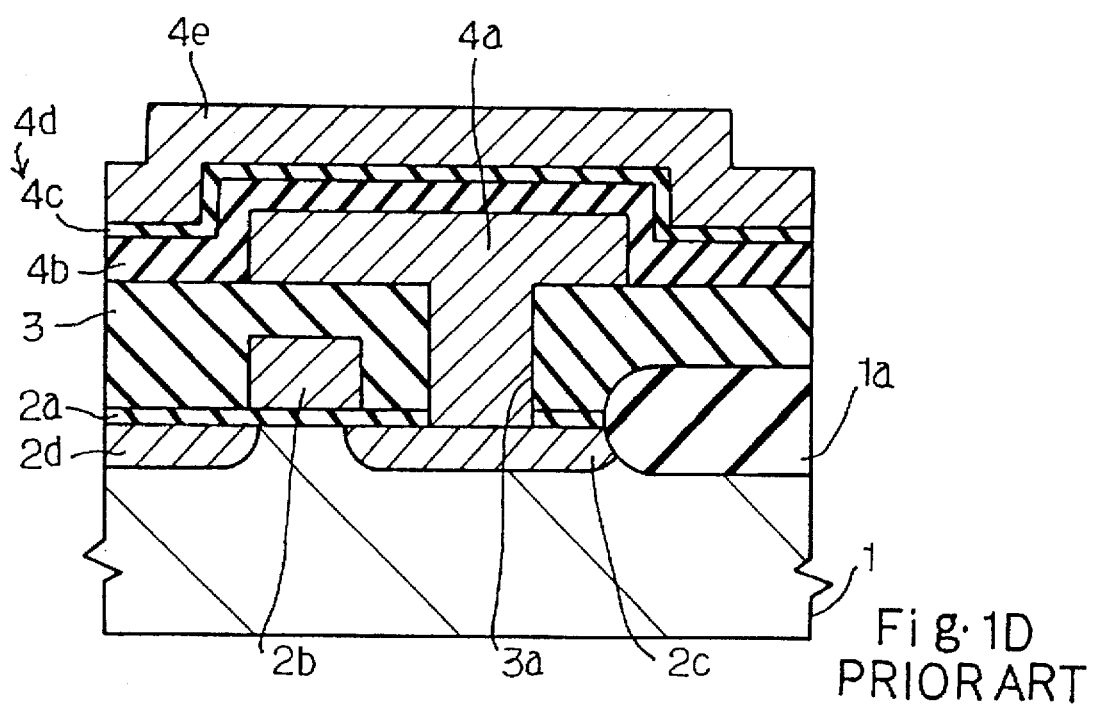
Figure 2:
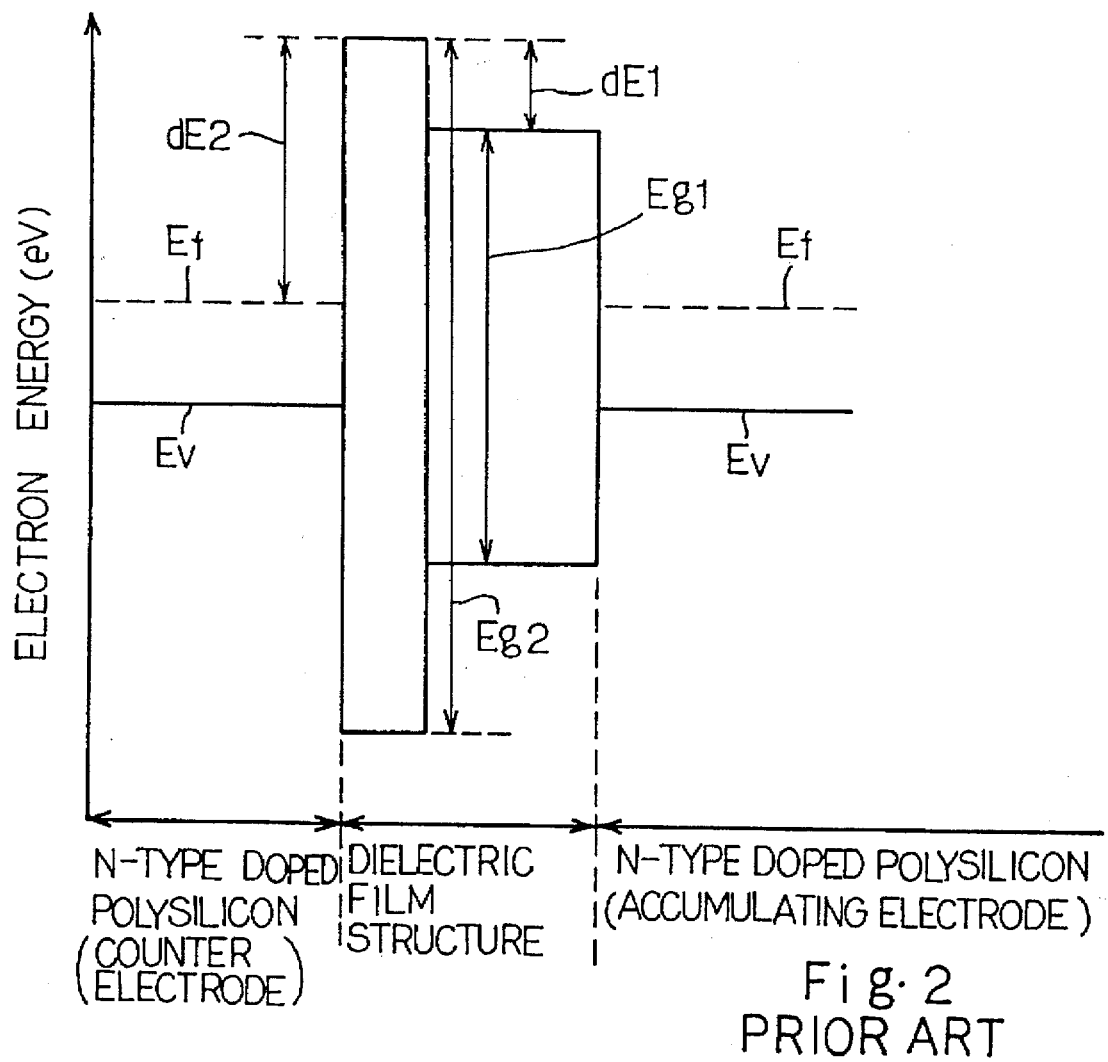
FIG. 2 is a diagram showing the energy band created in the storage capacitor in thermal equilibrium.
Figure 3A:
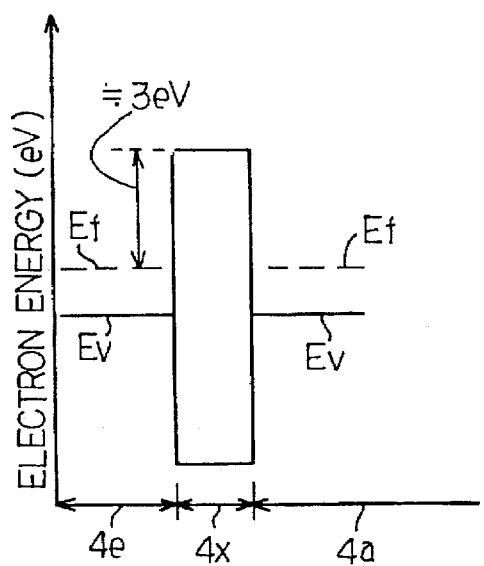
FIGS. 3A to 3C are diagrams showing equivalent energy bands under different bias conditions.
Figure 3B:
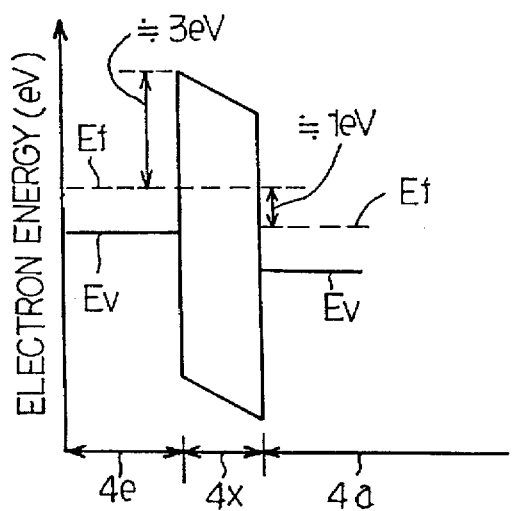
Figure 3C:
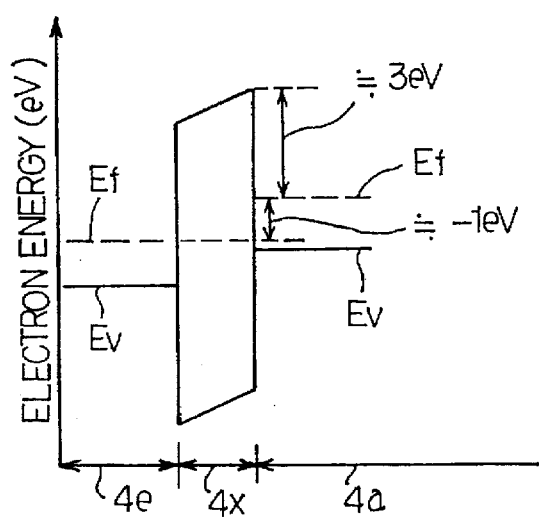

FIGS. 4A to 4F illustrates a process sequence for fabricating a dynamic random access memory cell embodying the present invention. The process starts with preparation of a p-type silicon substrate 10. A field oxide layer 10a is selectively grown on the major surface of the p-type silicon substrate 10, and defines active areas. A pair of dynamic random access memory cells is assigned to one of the active areas, and only one of the dynamic random access memory cells is illustrated in FIGS. 4A to 4F. Although description is made on the dynamic random access memory cell, the other dynamic random access memory cells are concurrently fabricated on the p-type silicon substrate 10.

The active area is thermally oxidized, and the thermal oxidation grows a gate oxide layer 11a over the active area. Conductive substance is deposited over the entire surface of the structure, and is patterned into a gate electrode 11b. The gate electrode 11b forms a part of one of the word lines of a dynamic random access memory device.

Subsequently, n-type dopant impurity is ion implanted into the active area, and a source region 11c and a drain region 11d are formed in the active area in a self-aligned manner with the gate electrode 11b. The gate oxide layer 11a, the gate electrode 11b, the source region 11c and the drain region 11d as a whole constitute a switching transistor 11 incorporated in the dynamic random access memory cell.

Figure 4A:
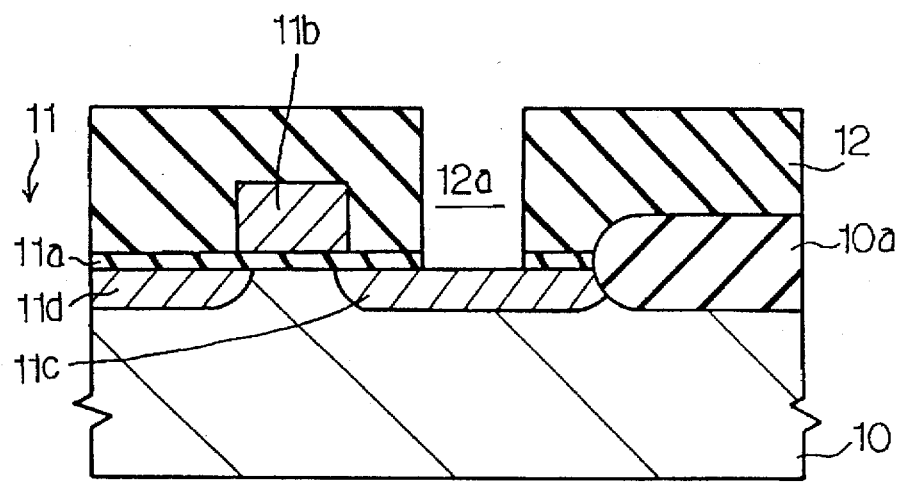
FIGS. 4A to 4F are cross sectional views showing a process of fabricating a dynamic random access memory cell according to the present invention.

Insulating substance is deposited over the entire surface of the structure, and forms an first inter-level insulating layer 12. An appropriate photo-resist mask (not shown) is formed on the first inter-level insulating layer 12, and exposes a part of the first inter-level insulating layer 12 over the source region 11c. Using the photo-resist mask, the first inter-level insulating layer 12 and the gate oxide layer 11a are partially etched away, and a contact hole 12a is formed in the first inter-level insulating layer 12 as shown in FIG. 4A.

Figure 4B:
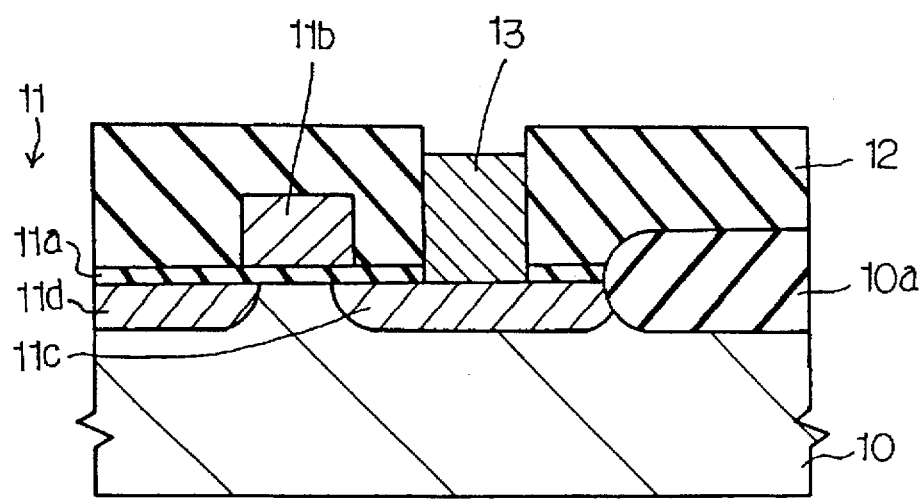

Tungsten is, by way of example, grown in the contact hole 12a, and the contact hole 12a is plugged with a tungsten piece as shown in FIG. 4B. The tungsten plug may be formed through an etch-back on a tungsten layer deposited by using a sputtering. The conductive substance for the plug 13 is not limited to the tungsten. Molybdenum, copper and titanium nitride are available for the plug 13.

Subsequently, non-doped polysilicon is deposited to 150 nanometers thick over the first inter-level insulating layer 12 by using a low-pressure chemical vapor deposition, and forms a non-doped polysilicon layer (not shown). The non-doped polysilicon layer penetrates into the contact hole 12a, and is held in contact with the tungsten plug 13.

Figure 4C:
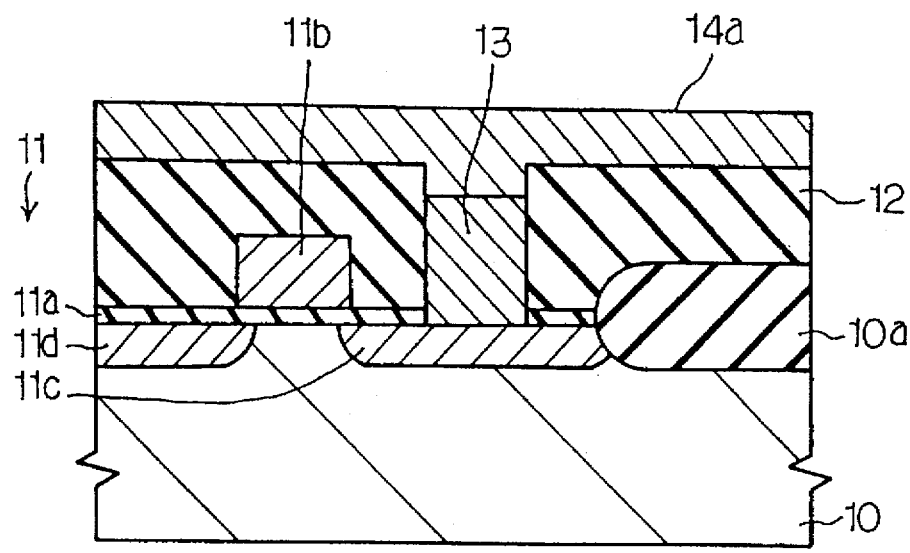
Figure 4D:
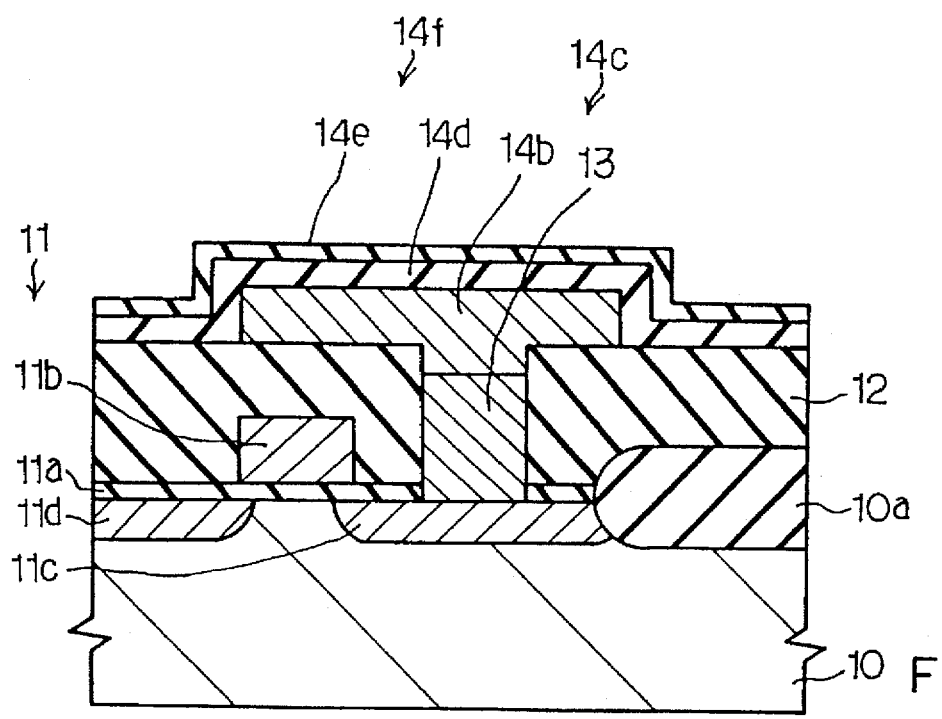

Although group-III element such as, for example, boron imparts the p-type conductivity to the polysilicon, boron difluoride is ion implanted into the non-doped polysilicon layer at dose of $5 \times 10^{15}$ cm$^{-2}$ under the acceleration energy of 30 KeV. The polysilicon layer implanted with the boron difluoride is annealed, and is converted to a p-type polysilicon layer 14a. The tungsten plug 13 blocks the n-type source region 11c from the p-type dopant impurity, and a p-n junction is not formed on the n-type source region 11c. The p-type polysilicon layer 14a contains boron at $10^{20}$ cm$^{-3}$. The resultant structure of this stage is illustrated in FIG. 4C.

An appropriate photo-resist mask (not shown) is provided on the p-type polysilicon layer 14a, and the p-type polysilicon layer 14a is patterned into a p-type polysilicon strip 14b, and forms an accumulating electrode 14c together with the tungsten piece 13.

Silicon nitride is deposited over the entire surface of the structure by using a low-pressure chemical vapor deposition, and the accumulating electrode 14c is covered with a silicon nitride layer 14d. The surface of the silicon nitride layer 14d is oxidized in water-vapor containing oxygen gas, and a silicon oxide layer 14e is laminated on the silicon nitride layer 14d as shown in FIG. 4C. The silicon nitride layer 14d and the silicon oxide layer 14e form in combination a dielectric film structure 14f. The thickness of the silicon nitride layer 14d and the thickness of the silicon oxide layer 14e are determined from the thickness of an equivalent silicon oxide layer.

Figure 4E:
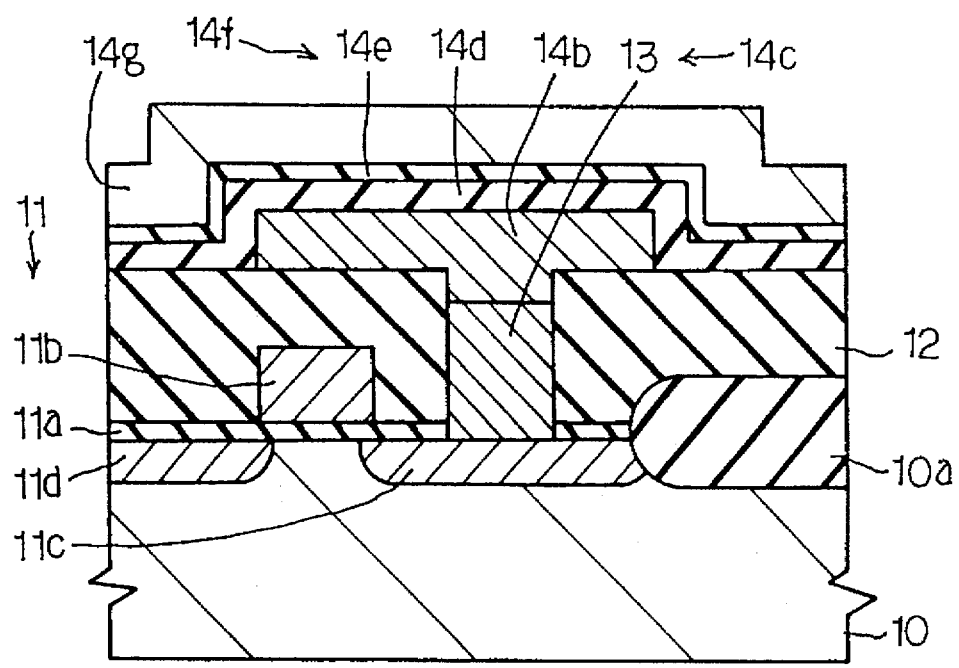

Non-doped polysilicon is deposited to 150 nanometers thick by using the low-pressure chemical vapor deposition over the silicon oxide layer 14e, and forms a non-doped polysilicon layer 14g as shown in FIG. 4E.

Boron difluoride is ion implanted into the non-doped polysilicon layer 14g at dose of $5 \times 10^{15}$ cm$^{-2}$ under the acceleration energy of 30 KeV. The non-doped polysilicon layer 14g is converted to a p-type doped polysilicon layer 14h. The polysilicon layer implanted with the boron difluoride is annealed, and the boron concentration is of the order of $10^{20}$ cm$^{-3}$.

Figure 4F:
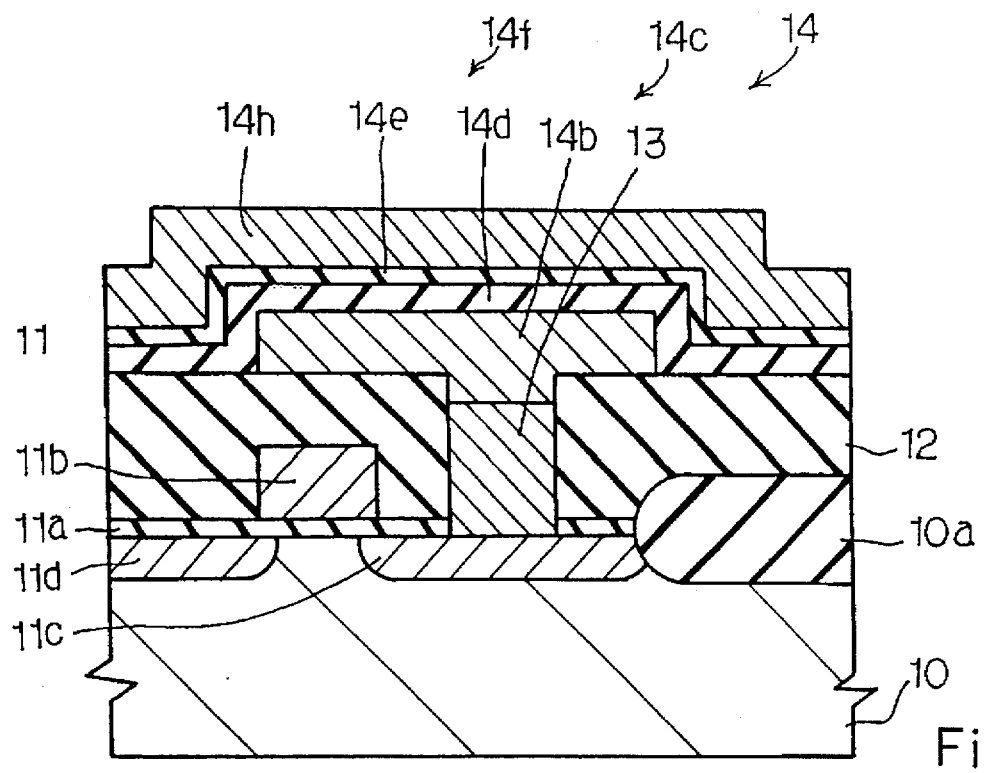

An appropriate photo-resist mask (not shown) is provided on the p-type polysilicon layer, and exposes an area assigned to a bit contact. The patterned p-type polysilicon layer serves as a counter electrode 14h, and the accumulating electrode 14c, the dielectric film structure 14f and the counter electrode 14h as a whole constitute a stacked storage capacitor 14 of the dynamic random access memory cell. The resultant structure is illustrated in FIG. 4F.

Though not shown in the drawings, a second inter-level insulating layer is deposited over the stacked storage capacitor 14 and the first inter-level insulating layer 12, and a bit contact (not shown) is formed through the first and second inter-level insulating layers. The n-type drain region 11d is partially exposed to the bit contact. Conductive metal is deposited on the second inter-level insulating layer, and is patterned into a bit line (not shown) held in contact through the bit contact with the n-type drain region 11d.

Figure 5:
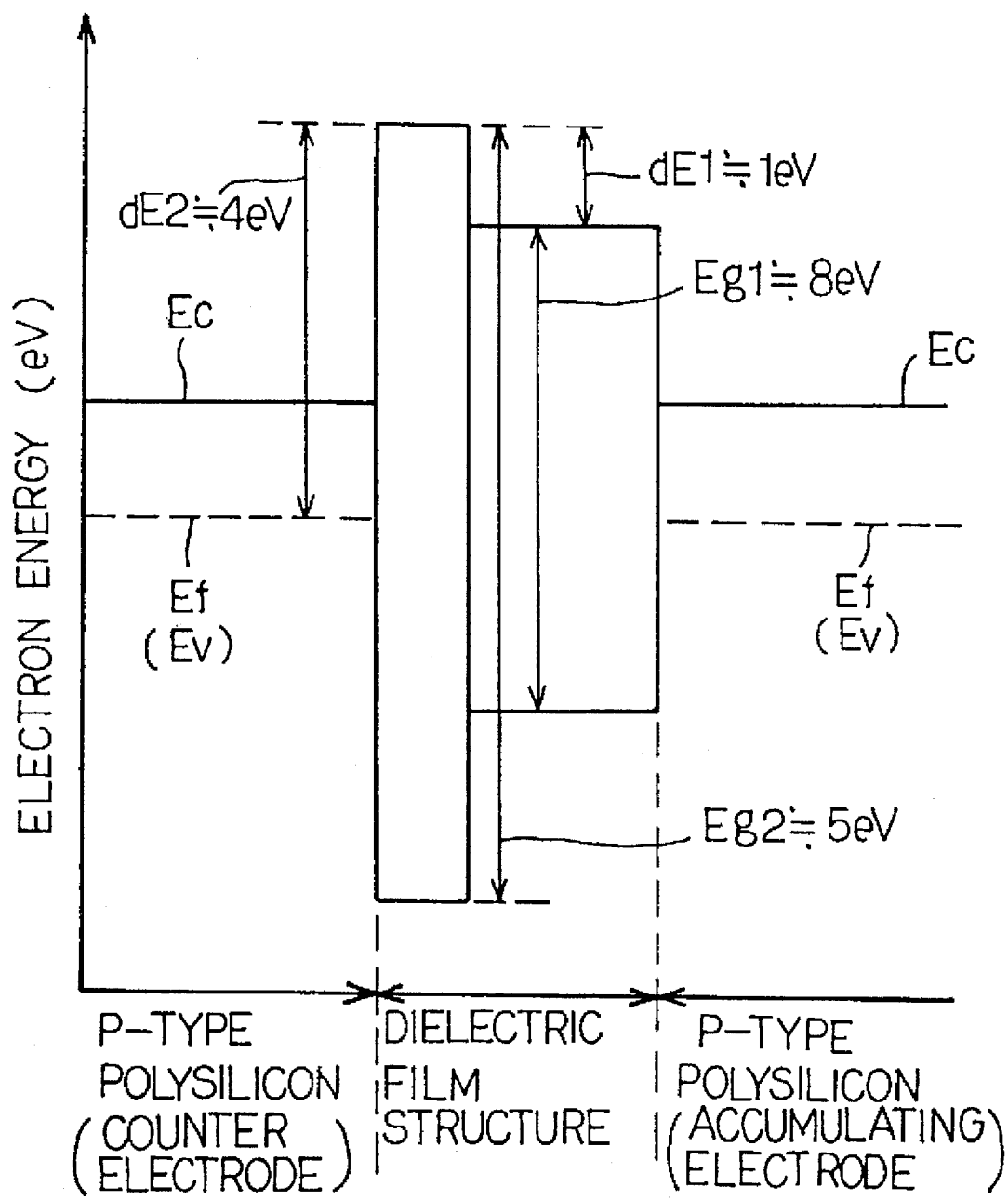
FIG. 5 is a diagram showing an energy band created in a stacked storage capacitor incorporated in the dynamic random access memory cell.

Subsequently, description is made on the theoretical study on the dielectric film structure 14f of the storage capacitor 14. FIG. 5 illustrates an energy band created in the stacked storage capacitor 14 in thermal equilibrium, and the work function is taken into account. Ec and Ef are respectively indicative of the bottom edge of the conduction band and the Fermi level. The silicon nitride layer 14d and the silicon oxide layer 14e have respective energy band gaps Eg1 of 8 eV and EG2 of 5 eV, and the potential discontinuity dE1 of 1 eV takes place between the bottom edge of the conduction band for the silicon oxide layer 14e and the bottom edge of the conduction band for the silicon nitride layer 14d. The bottom edge of the conduction band for the silicon oxide layer 14e is higher in electron energy than the Fermi level of the p-type polysilicon accumulating/counter electrodes 14b/14h, and, accordingly, the silicon oxide layer provides a potential barrier dE2 of 4 eV. The Fermi level and the top edge Ev of the valence band are almost overlapped with each other in the heavily doped p-type polysilicon, and, accordingly, the difference between the bottom edge Ec of the conduction band and the Fermi level Ef is approximately equal to the energy band gap of 1.1 eV.

The counter electrode 14h is biased to a half of the positive power voltage Vcc, and the accumulating electrode 14b is changed between the ground level and the positive power voltage Vcc. In this instance, the positive power voltage Vcc is regulated to 2 volts.

Figure 6A:
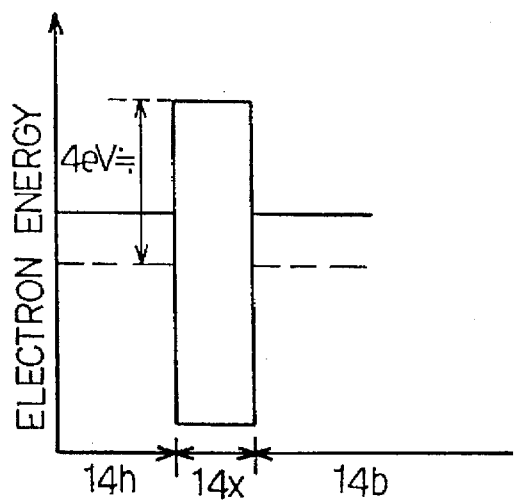
FIGS. 6A to 6C are diagrams showing equivalent energy bands under different bias conditions.

When the dielectric film structure 14f is replaced with an equivalent silicon layer 14x, the energy band is represented by an energy band diagram shown in FIG. 6A without bias voltage between the accumulating electrode 14b and the counter electrode 14h, and the equivalent silicon oxide layer 14x provides the potential barrier of about 4 eV.

Figure 6B:
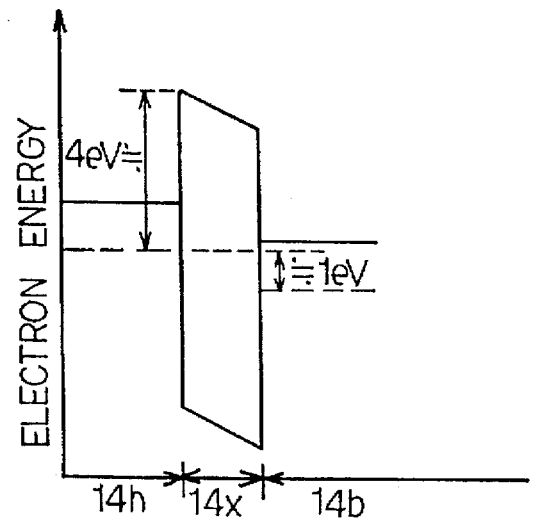

If the accumulating electrode 14b is biased with respect to the counter electrode 14h by +1 volt, the potential barrier height for the counter electrode 14h to the equivalent silicon oxide layer 14x is about 4 eV as shown in FIG. 6B. The Fermi level of the p-type polysilicon counter electrode 14h falls within the forbidden band of the p-type polysilicon accumulating electrode 14b in so far as the potential difference is a positive value smaller than 1.1 volts, and the amount of direct tunneling current is extremely small.

Figure 6C:
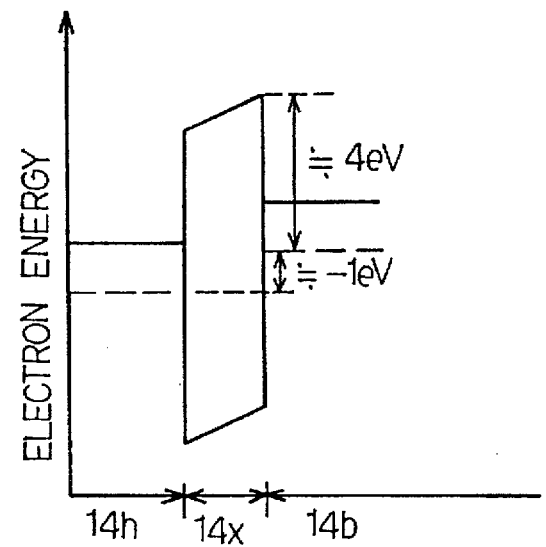

On the other hand, if the accumulating electrode 14b is biased to the counter electrode 14h by −1 volt, the potential barrier height for the accumulating electrode to the equivalent silicon oxide layer 14x is about 4 eV as shown in FIG. 6C. The Fermi level of the p-type polysilicon accumulating electrode 14b also falls within the forbidden band of the p-type polysilicon counter electrode 14h in so far as the potential difference is a negative value larger than 1.1 volts, and the amount of direct tunneling current is extremely small.

Thus, the direct tunneling current is drastically decreased in so far as the potential difference between the accumulating electrode 14b and the counter electrode 14h is larger than −1.1 volts and smaller than 1.1 volts.

If the potential difference is larger than 1.1 volts or smaller than −1.1 volts, the potential barrier of 4 eV relates to the direct tunneling phenomenon. The tunneling probability is proportional to $$\exp[-T(phi)^{1/2}]$$

where T is the thickness of an insulating layer and phi is the potential barrier height. Even if the positive power voltage Vcc is equal to or greater than 2.2 volts, the direct tunneling current of the present invention is decreased to $$\exp[-(4)^{1/2}]/\exp[-(3)^{1/2}]=0.77$$

with respect to the direct tunneling current of the prior art stacked storage capacitor on the assumption that the equivalent silicon oxide layer is equal in thickness therebetween.

The equivalent silicon oxide layer 14x is decreased in thickness to $$(3)^{1/2}/(4)^{1/2}=0.87$$

with respect to the equivalent silicon oxide layer 4x in on the assumption that the amount of direct tunneling current is equal therebetween.

Thus, the p-type polysilicon accumulating electrode 14b and the p-type polysilicon counter electrode 14h are effective against the direct tunneling current.

The present inventor confirmed the theoretical study as follows. First, the present inventor fabricated a storage capacitor of the present invention, a prior art storage capacitor and a comparative storage capacitor.

The storage capacitor of the present invention included an accumulating electrode having a p-type polysilicon strip, a dielectric film structure and a p-type polysilicon counter electrode formed through the ion implantation of boron difluoride. A silicon nitride layer was deposited through the low-pressure chemical vapor deposition, and the surface of the silicon nitride layer was thermally oxidized. The silicon nitride layer and the silicon oxide layer formed in combination the dielectric film structure, and was equivalent to a silicon oxide layer of 5 nanometers thick.

The prior art storage capacitor included a phosphorous-doped polysilicon accumulating electrode, a dielectric film structure and a phosphorous-doped polysilicon counter electrode. The dielectric film structure was fabricated as similar to the storage capacitor of the present invention, and was equivalent to the silicon oxide layer of 5 nanometers thick.

The comparative storage capacitor included a boron-doped polysilicon accumulating electrode, a dielectric film structure and a boron-doped polysilicon counter electrode. The boron-doped polysilicon accumulating/counter electrodes were formed of polysilicon strips of 250 nanometers thick implanted with the boron at dose of $5\times10^{15}$ cm$^-$ under acceleration energy of 30 KeV. The dielectric film structure was similar to that of the storage capacitor of the present invention.

Subsequently, the present inventor measured leakage current in terms of bias voltage. When the counter electrodes were positively biased to the accumulating electrodes, the prior art storage capacitor, the comparative capacitor and the storage capacitor of the present invention varied the leakage current density as indicated by plots P1, B1 and BF1. The leakage current density of the storage capacitor of the present invention was only 7 percent of the leakage current density of the prior art storage capacitor, and the leakage current density of the comparative storage capacitor was 33 percent of the leakage current density of the prior art storage capacitor.

On the other hand, when the counter electrodes were negatively biased to the accumulating electrodes, the prior art storage capacitor, the comparative capacitor and the storage capacitor of the present invention varied the leakage current density as indicated by plots P2, B2 and BF2. The leakage current density of the storage capacitor of the present invention was only 8 percent of the leakage current density of the prior art storage capacitor, and the leakage current density of the comparative storage capacitor was 33 percent of the leakage current density of the prior art storage capacitor.

Thus, the leakage current density ratio of the storage capacitor of the present invention to the prior art storage capacitor is much smaller than the theoretical ratio.

The present inventor further studies the leakage current density ratio, i.e., the reason why the leakage current density of the present invention is smaller than the theoretical value or the leakage current density of the prior art is larger than the theoretical value.

The difference in leakage current density between the prior art and the present invention is too large to derive it from the difference in work function. Although the dielectric film structure of the prior art storage capacitor is identical with the dielectric film structure of the comparative storage capacitor and the dielectric film structure of the present invention, it is impossible to forward the study without consideration of differences between the dielectric film structures.

The prior art storage capacitor has the n-type polysilicon accumulating electrode covered with the dielectric film structure. On the other hand, the comparative storage capacitor and the present invention have respective p-type polysilicon accumulating electrodes respectively covered with the dielectric film structures. The accumulating electrodes are exposed to the air until the silicon nitride layers are deposited thereover, and native oxide are grown on the surfaces of the accumulating electrodes. The n-type polysilicon promotes the growth of the native oxide rather than the p-type polysilicon. As a result, the native oxide layer on the n-type polysilicon layer is thicker than the native oxide layers on the n-type polysilicon layers. The native oxide layer are not pure, and are considered to form a transitional layers of oxygen-containing silicon nitride between the silicon nitride film and the accumulating electrodes. The transitional layers are poor in quality. The thick native oxide layer forms a thick transitional layer, and makes the equivalent thickness of the prior art dielectric film structure thinner than the equivalent thickness of the comparative dielectric film structure and the equivalent thickness of the dielectric film structure of the present invention.

The present inventor concludes that the n-type polysilicon accumulating electrode decreases the thickness of the equivalent silicon oxide layer, and increases the leakage current density over the theoretical value. Thus, the p-type polysilicon accumulating electrode is desirable, and allows the manufacturer to decrease the thickness of the dielectric film structure.

Figure 7A:
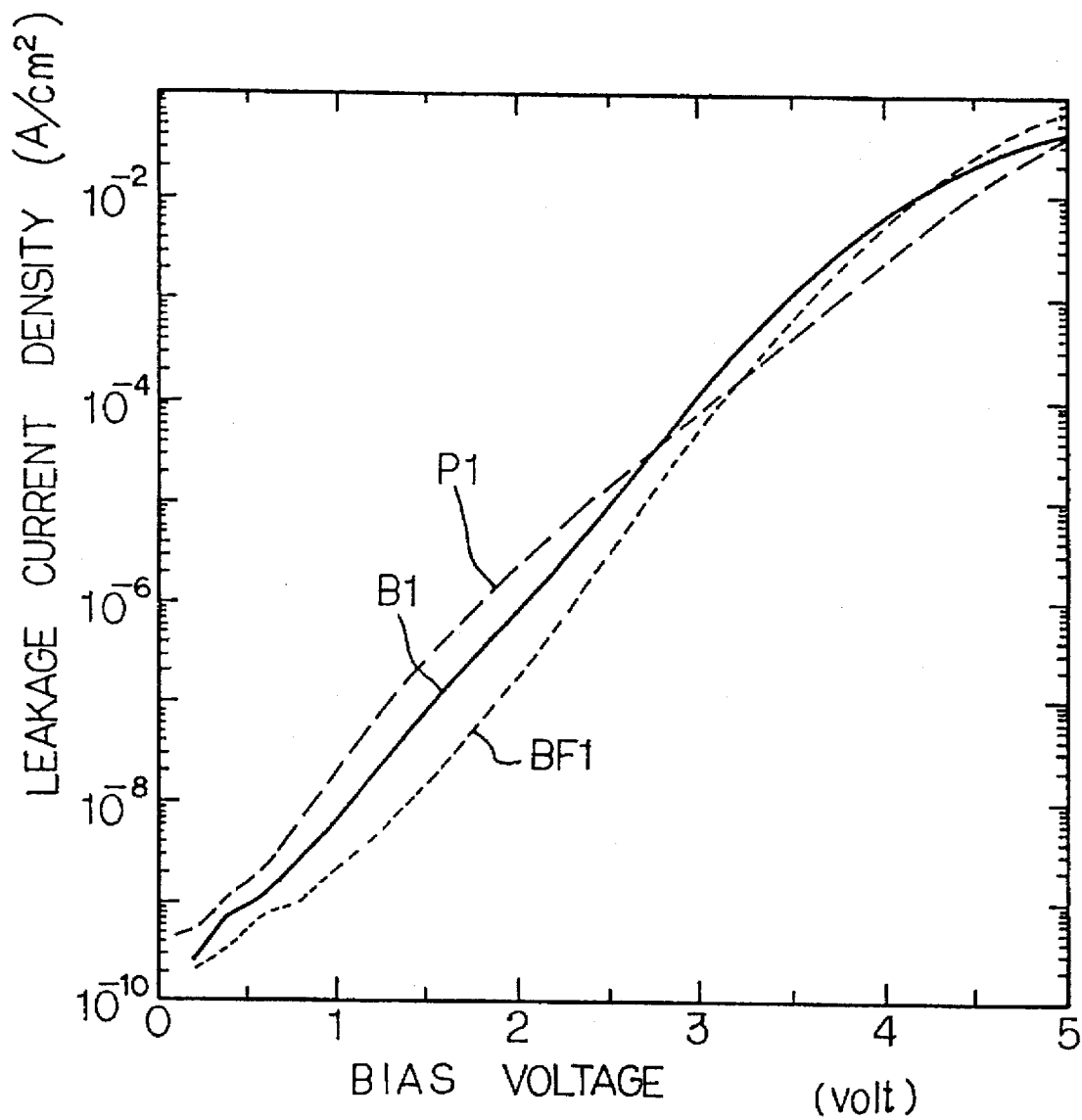
FIGS. 7A and 7B are graphs showing leakage current in terms of a potential difference.
Figure 7B:
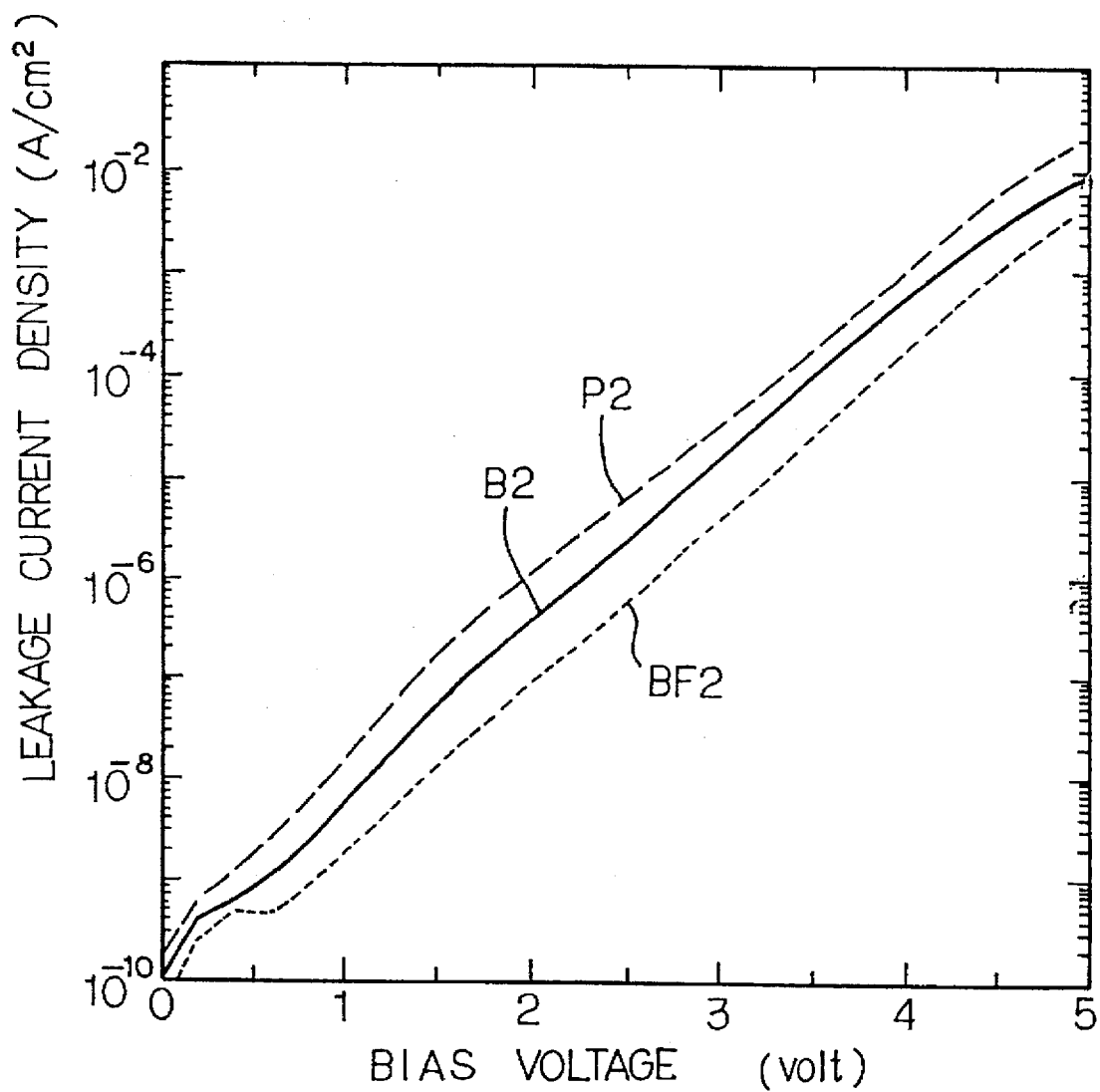

Subsequently, the present inventor studies the difference between the comparative storage capacitor and the storage capacitor of the present invention. As shown in FIGS. 7A and 7B, the storage capacitor of the present invention is superior to the comparative storage capacitor.

The difference between the present invention and the comparative storage capacitor is the ion implanted into the counter electrode. The boron is implanted into the counter electrode of the comparative storage capacitor, and the boron difluoride is implanted into the counter electrode of the present invention.

Figure 8:
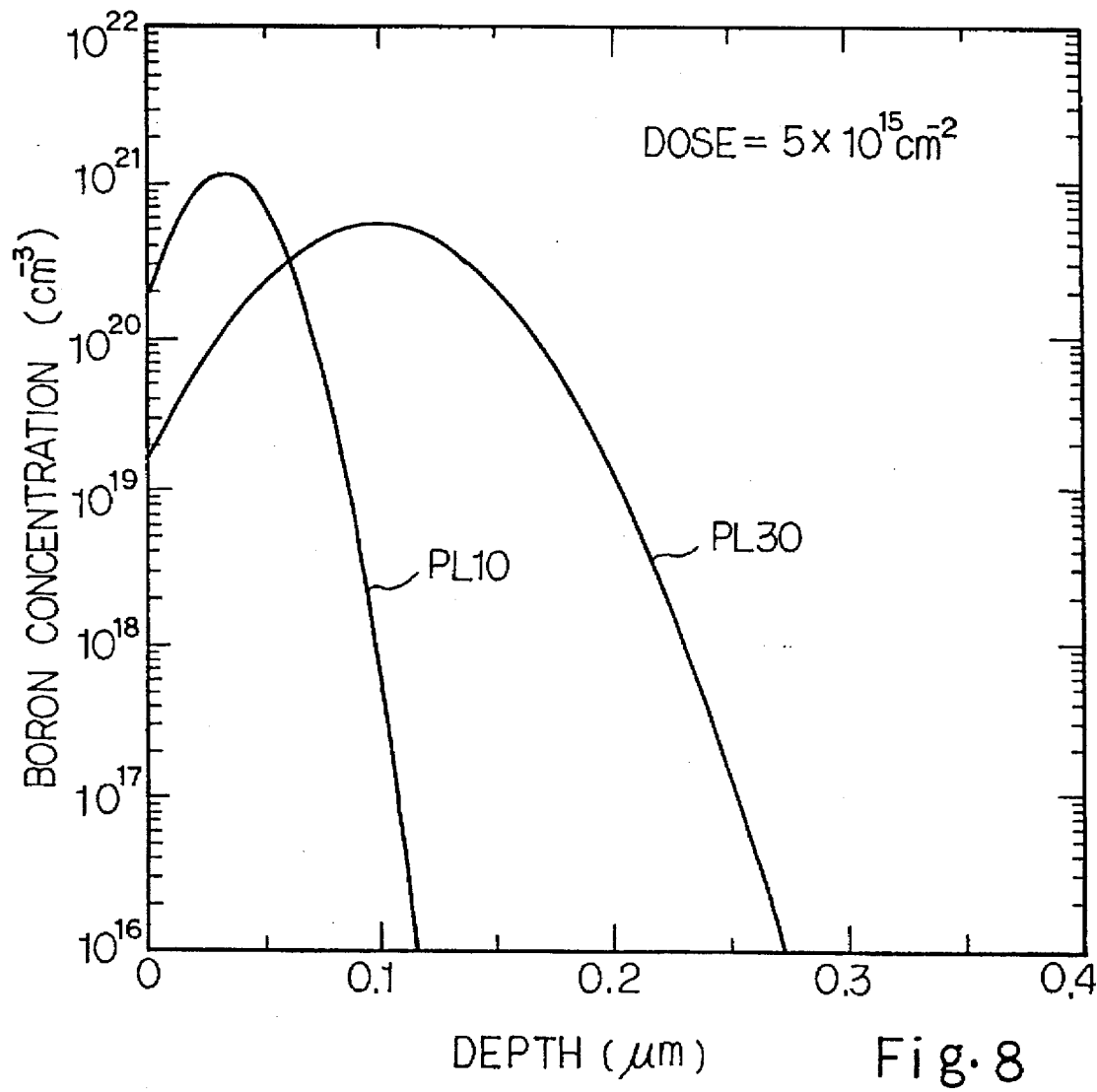
FIG. 8 is a graph showing boron concentration in terms of depth under different acceleration energy levels.

When the boron is ion implanted into a silicon layer at dose of $5\times10^{15}$ cm$^{-2}$, the boron concentration is varied with depth. Plots PL10 and PL30 are representative of the boron concentration under the acceleration energy of 10 KeV and the boron concentration under the acceleration energy of 30 KeV (see FIG. 8). If a polysilicon counter electrode is of the order of 150 nanometers thick, the acceleration energy is regulated to 10 KeV, because a higher acceleration energy causes the boron to penetrate into the dielectric film structure thereunder, and deteriorates the dielectric film. However, a standard ion implanting system hardly controls the beam current under such a low energy, and the dose of the order of $10^{15}$ cm$^{-2}$ prolongs the ion-implantation. For this reason, the boron implantation is usually carried out under the acceleration energy around 30 KeV or higher.

The ion-implantation under such a large energy requires a thick non-doped polysilicon layer so as to prohibit the implanted boron from penetration, and the non-doped polysilicon is deposited to about 250 nanometers thick. As will be understood from plots PL30, such a thick non-doped polysilicon layer makes the average boron concentration low. Especially, the boundary between the p-type polysilicon layer and the dielectric film structure suffers from low boron concentration.

Figure 9:
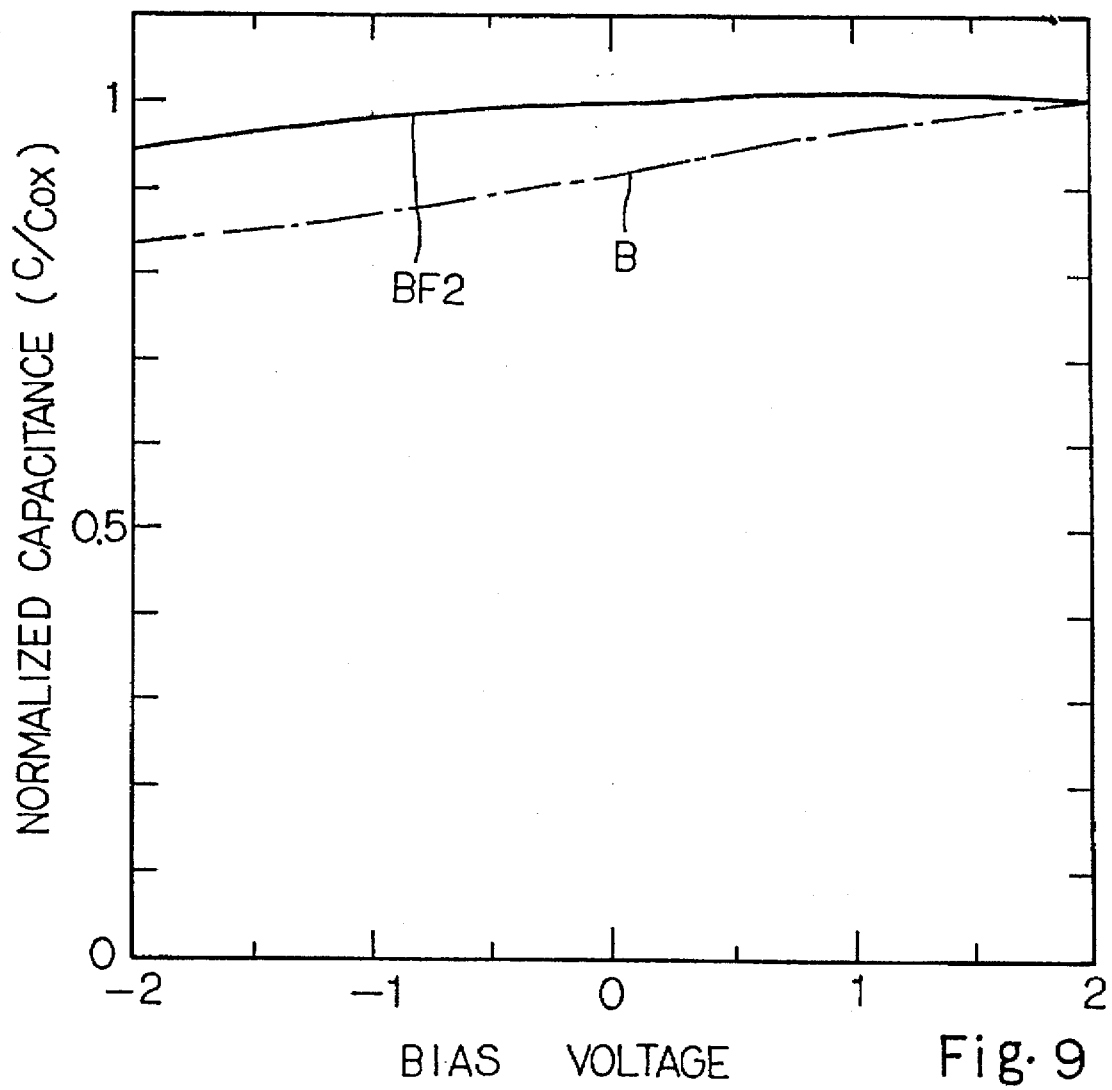
FIG. 9 is a graph showing a normalized capacitance in terms of a bias voltage.

The low dopant impurity concentration at the boundary results in a depletion layer under a negative bias condition. This conclusion is supported by Plots B and Plots BF2 in FIG. 9. Plots B and Plots BF2 are representative of the capacitance-to-voltage characteristics of the comparative storage capacitor and the capacitance-to-voltage characteristics of the present invention, respectively.

The difference in leakage current density between the comparative capacitor and the capacitor according to the present invention is derived from the existence of the depletion layer and the existence of fluorine. After the BF$_2$ ion-implantation, the p-type polysilicon layer is annealed, and the fluorine is diffused during the heat treatment. The fluorine is considered to cut off the leakage current paths.

As will be appreciated from the foregoing description, the boron difluoride is effective against the leakage current, and the process using the boron difluoride allows the manufacturer to make the equivalent dielectric film thin without increase of the leakage current. The storage capacitor with the thin equivalent dielectric film increases the capacitance, and the manufacturer can decrease the occupation area assigned to each dynamic random access memory cell.

Although particular embodiments of the present invention have been shown and described, it will be obvious to those skilled in the art that various changes and modifications may be made without departing from the spirit and scope of the present invention.

For example, the storage capacitor may have another three-dimensional structure such as, for example, a trench-stacked type storage capacitor.

Figure 10:
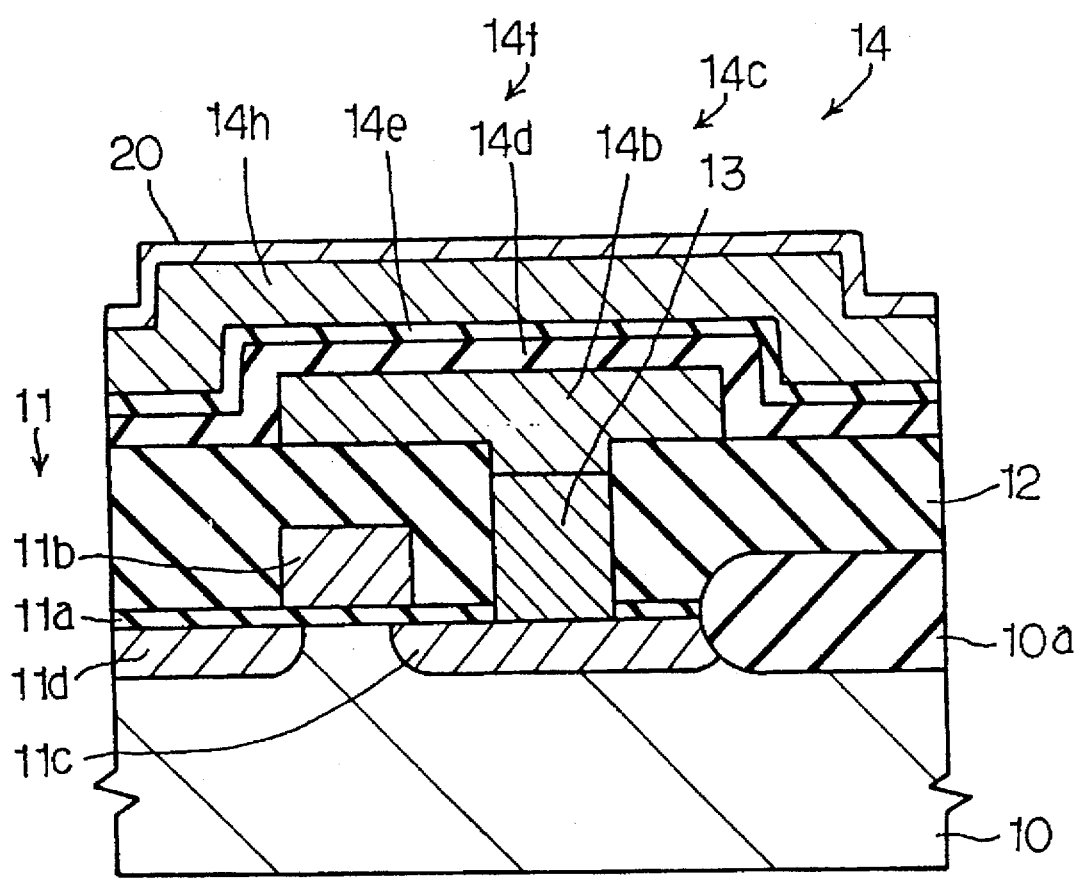
FIG. 10 is a cross sectional view showing an essential step of another fabrication process according to the present invention.

The storage capacitor may be formed in and/or on an n-type well or layer formed in an n-type semiconductor substrate. The counter electrode may be formed of the p-type polysilicon layer covered with a conductive metal layer as shown in FIG. 10.

The dynamic random access memory cell may form a part of a memory section which in turn forms a part of an ultra large scale integration together with other function blocks.

Finally, the present invention is applicable to any process of fabricating a semiconductor device having a capacitor.

What is claimed is:

1. A process of fabricating a semiconductor device, comprising the steps of:

a) forming a first electrode having a first semiconductor layer doped with a p-type impurity;

b) covering a surface of said first semiconductor layer with a dielectric layer;

c) covering said dielectric layer with a second semiconductor layer; and d) implanting boron difluoride into said second semiconductor layer for forming a second electrode held in contact with said dielectric layer, said first electrode, said dielectric layer and said second electrode form in combination a capacitor.

2. The process as set forth in claim 1, in which said capacitor serves as a storage capacitor of a dynamic random access memory cell.

3. The process as set forth in claim 1, further comprising a step of fabricating a switching transistor coupled to said first electrode before said step a).

4. The process as set forth in claim 3, in which said switching transistor is an n-channel enhancement type field effect transistor having an n-type source region, said process further comprising the steps of covering said n-channel enhancement type field effect transistor with an inter-level insulating layer after said step of fabricating a switching transistor, forming a contact hole in said inter-level insulating layer to which said n-type source region is partially exposed, and plugging said contact hole with a conductive metal piece before said step a).

5. The process as set forth in claim 1, in which said step a) includes the sub-steps of a-1) depositing a non-doped polysilicon layer, a-2) implanting boron difluoride into said non-doped polysilicon layer so as to convert said non-doped polysilicon layer to a p-type polysilicon layer, and a-3) patterning said p-type polysilicon layer into said first semiconductor layer.

6. The process as set forth in claim 5, in which said step a) further includes the sub-step of treating said p-type polysilicon layer with heat between said sub-step of a-2) and said sub-step of a-3).

7. The process as set forth in claim 1, in which said step b) includes the sub-steps of b-1) depositing a silicon nitride layer over said first semiconductor layer, and b-2) oxidizing a surface portion of said silicon nitride layer so as to form said dielectric layer together with a remaining portion of said silicon nitride layer.

8. The process as set forth in claim 1, in which said step c) includes the sub-steps of c-1) depositing a non-doped polysilicon layer over said dielectric layer, c-2) implanting said boron difluoride into said non-doped polysilicon layer so as to convert said non-doped polysilicon layer into a p-type polysilicon layer, and c-3) patterning said p-type polysilicon layer into said second semiconductor layer.

9. The process as set forth in claim 8, in which said step c) further includes the sub-step of treating said p-type polysilicon layer with heat between said sub-step of c-2) and said sub-step of c-3).

10. The process as set forth in claim 8, further comprising the sub-step of covering said p-type polysilicon layer with a metal layer before said sub-step c-3).

11. A process of fabricating a dynamic random access memory cell, comprising the steps of:

preparing a semiconductor substrate;

fabricating an n-channel enhancement type switching transistor having an n-type source region on said semiconductor substrate;

covering said n-channel enhancement type switching transistor with an inter-level insulating layer;

forming a contact hole in said inter-level insulating layer so as to expose a part of said n-type source region to said contact hole;

plugging said contact hole with a conductive metal piece, said conductive metal piece being held in contact with said n-type source region;

depositing a first non-doped polysilicon layer over said inter-level insulating layer so as to be held in contact with said conductive metal piece;

implanting boron difluoride into said first non-doped polysilicon layer so as to convert said first non-doped polysilicon layer to a first p-type polysilicon layer;

treating said first p-type polysilicon layer with heat;

patterning said first p-type polysilicon layer into an accumulating electrode;

depositing a silicon nitride layer over said accumulating electrode, oxidizing a surface portion of said silicon nitride layer so as to form a dielectric layer together with a remaining portion of said silicon nitride layer;

depositing a second non-doped polysilicon layer over said dielectric layer;

implanting boron difluoride into said second non-doped polysilicon layer so as to convert said second non-doped polysilicon layer into a second p-type polysilicon layer;

treating said second p-type polysilicon layer with heat; and patterning said second p-type polysilicon layer into a counter electrode.

12. A process of fabricating a semiconductor device including a dynamic random access memory cell having a capacitor, comprising the step of ion implanting boron difluoride into a polysilicon over a dielectric layer for forming a counter electrode.

* * * * *